(12) United States Patent
Kudo et al.

(10) Patent No.: US 7,898,232 B2
(45) Date of Patent: Mar. 1, 2011

(54) VOLTAGE CLAMP CIRCUIT, A SWITCHING POWER SUPPLY DEVICE, A SEMICONDUCTOR INTEGRATED CIRCUIT DEVICE, AND A VOLTAGE LEVEL CONVERSION CIRCUIT

(75) Inventors: Ryotaro Kudo, Tokyo (JP); Koji Tateno, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/534,756

(22) Filed: Aug. 3, 2009

(65) Prior Publication Data

US 2009/0295351 A1 Dec. 3, 2009

Related U.S. Application Data

(62) Division of application No. 10/586,687, filed as application No. PCT/JP2005/000328 on Jan. 14, 2005, now Pat. No. 7,663,354.

(30) Foreign Application Priority Data

Jan. 21, 2004 (JP) ............................. 2004-012717

(51) Int. Cl.
*G05F 1/00* (2006.01)
*G05F 3/16* (2006.01)
(52) U.S. Cl. ...................................... 323/282; 323/225
(58) Field of Classification Search ................. 323/222, 323/223, 225, 268, 271, 282, 285, 283; 363/59, 363/60; 327/333, 390; 326/63, 68, 80–83, 326/86, 87
See application file for complete search history.

(56) References Cited

U.S. PATENT DOCUMENTS

| | | | | |
|---|---|---|---|---|
| 6,346,829 B1 * | 2/2002 | Coddington | ................. | 326/68 |
| 6,359,490 B1 | 3/2002 | Oyamada | | |
| 6,359,493 B2 * | 3/2002 | Satomi | ....................... | 327/333 |
| 6,670,842 B2 * | 12/2003 | Kamenicky | ................. | 327/389 |

(Continued)

FOREIGN PATENT DOCUMENTS

JP 57-129534 8/1982

(Continued)

*Primary Examiner*—Bao Q Vu
*Assistant Examiner*—Jue Zhang
(74) *Attorney, Agent, or Firm*—Miles & Stockbridge P.C.

(57) ABSTRACT

The present invention provides a voltage clamping circuit which is operated in a stable manner with the simple constitution and a switching power source device which enables a high-speed operation. In a switching power source device, one of source/drain routes is connected to an input terminal to which an input voltage is supplied, a predetermined voltage to be restricted is supplied to a gate, and using a MOSFET which provides a current source between another source/drain route and a ground potential of the circuit, a clamp output voltage which corresponds to the input voltage is obtained from another source/drain route. The switching power source device further includes a first switching element which controls a current which is made to flow in an inductor such that the output voltage assumes a predetermined voltage and a second switching element which clamps an reverse electromotive voltage generated in the inductor when the first switching element is turned off to a predetermined potential. In such a switching power source device, the voltage clamping circuit is used in a feedback route for setting a dead time.

10 Claims, 9 Drawing Sheets

U.S. PATENT DOCUMENTS

| | | |
|---|---|---|
| 6,806,516 B2 | 10/2004 | Negishi et al. |
| 7,276,953 B1 * | 10/2007 | Peng et al. .................. 327/333 |
| 2003/0081436 A1 | 5/2003 | Takahashi et al. |
| 2003/0222285 A1 | 12/2003 | Negishi et al. |

FOREIGN PATENT DOCUMENTS

| | | |
|---|---|---|
| JP | 5-327465 A | 12/1993 |
| JP | 6-69435 A | 3/1994 |
| JP | 10-163826 | 6/1998 |
| JP | 2000-196433 A | 7/2000 |
| JP | 2000-357949 A | 12/2000 |
| JP | 2003-142999 A | 5/2003 |
| JP | 2003-347921 A | 12/2003 |

* cited by examiner

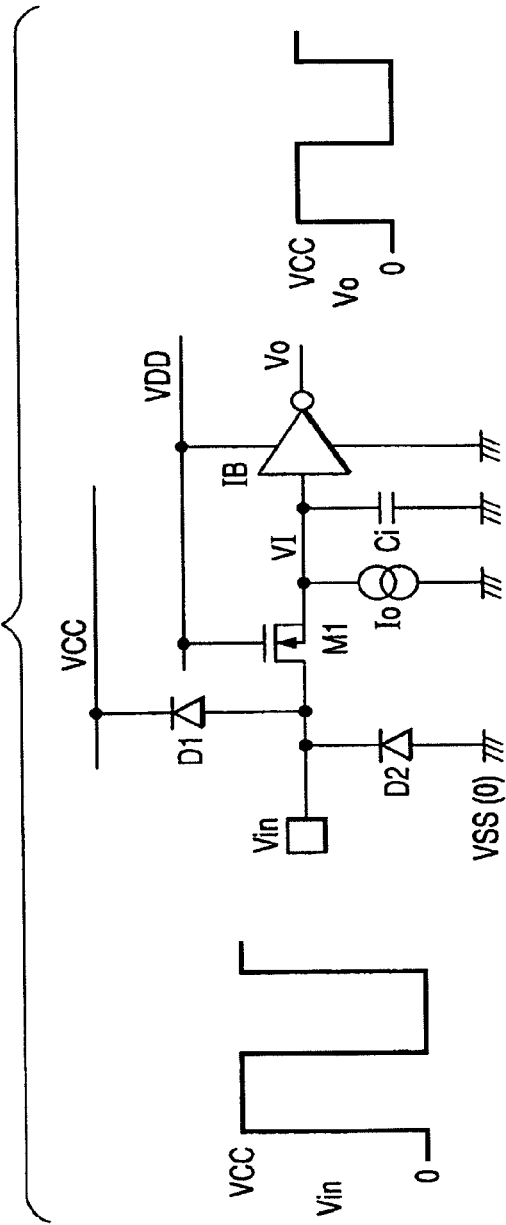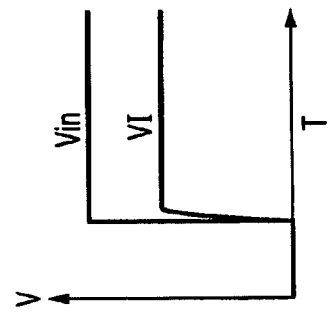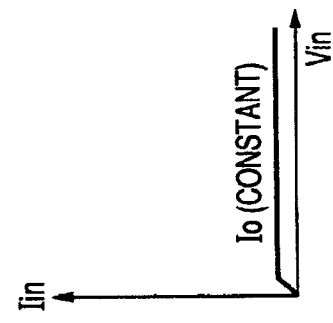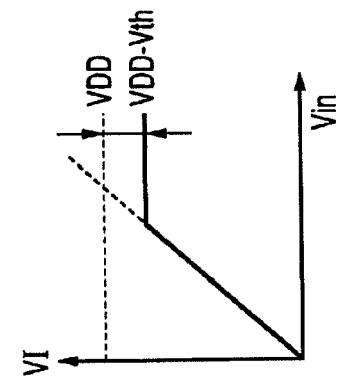

VOLTAGE CLAMP CIRCUIT, A SWITCHING POWER SUPPLY DEVICE, A SEMICONDUCTOR INTEGRATED CIRCUIT DEVICE, AND A VOLTAGE LEVEL CONVERSION CIRCUIT

CROSS-REFERENCE TO RELATED APPLICATION

This application is a division of application Ser. No. 10/586,687 filed Jul. 20, 2006 now U.S. Pat. No. 7,663,354, which is a 371 of International Application No. PCT/JP2005/000328 filed Jan. 14, 2005.

TECHNICAL FIELD

The present invention relates to a voltage clamping circuit (a voltage level shifting circuit), a switching power source device and a semiconductor integrated circuit device which is applicable to the voltage clamping circuit (the voltage level shifting circuit) and the switching power source device and, for example, to a technique which is effectively applicable to a switching power source device which is used for converting a high voltage to a low voltage.

As examples of a voltage clamping circuit which uses a MOSFET, there have been known voltage clamping circuits which are described in JP-A-6-69435 and JP-A-5-327465.
[Patent document 1] JP-A-6-69435
[Patent document 2] JP-A-5-327465

DISCLOSURE OF THE INVENTION

Problems to be Solved by the Invention

In the voltage clamping circuit described in the above-mentioned publication, an output-side node which generates an output voltage clamped by the MOSFET assumes a floating state and hence, there exists several drawbacks including a drawback that when a leaked current flows in the output-side node, a voltage on the output node side is elevated to a gate voltage or more so that a voltage clamping operation cannot be performed.

It is an object of the present invention to provide a voltage clamping circuit which is operated in a stable manner with the simple constitution and a switching power source device which enables a high-speed operation. The above-mentioned and other objects and novel features of the present invention will become apparent from the description of this specification and attached drawings.

MEANS FOR SOLVING THE PROBLEMS

To briefly explain the summary of typical inventions among the inventions disclosed in this specification, they are as follows. That is, one of source/drain routes is connected to an input terminal to which an input voltage is supplied, a predetermined voltage to be restricted is supplied to a gate, and using a MOSFET which provides a current source between another source/drain route and a ground potential of the circuit, a clamp output voltage which corresponds to the input voltage is obtained from another source/drain route.

In a switching power source device which includes a first switching element which generates a smooth output voltage by connecting a capacitor to an inductor in series and allows the output voltage to assume a predetermined voltage by controlling a current which flows in the inductor from the input voltage, and a second switching element which clamps a counter-electromotive voltage which is generated in the inductor to a predetermined potential when the first switching element assumes an OFF state, the switching power source device includes a control logic circuit which drives the first switching element with a high voltage signal corresponding to the input voltage by a first driving circuit, drives the second switching element by a second driving circuit with the high voltage, is operated at a low voltage lower than the input voltage, and forms a PWM signal such that an output voltage obtained from the capacitor assumes a predetermined voltage thus forming driving signals of the first driving circuit and the second driving circuit. The switching power source device further includes a first voltage clamping circuit which performs voltage clamping of the driving signal of the first switching element corresponding to the low voltage and feedbacks the clamped voltage to the input of the second driving circuit, and a second voltage clamping circuit which performs voltage clamping of a driving signal of the second switching element corresponding to the low voltage and feedbacks the clamped voltage to the input of the first driving circuit. A switching control is performed to prevent the first and second switching elements from simultaneously assuming an ON state, and the voltage clamping circuit has one of source/drain routes thereof connected to an input terminal to which the driving signals are supplied, and applies the low voltage to agate thereof. Using a MOSFET which includes a current source between another source/drain route and a ground potential of the circuit, a feedback signal which corresponds. to the driving signal is obtained from another of the source/drain route.

ADVANTAGE OF THE PRESENT INVENTION

The present invention allows the voltage clamping circuit and the switching power source to perform a stable voltage clamping operation at a high speed and with low power consumption.

BEST MODE FOR CARRYING OUT THE INVENTION

FIG. 1 shows a circuit diagram of one embodiment of a voltage clamping circuit according to the present invention. The voltage clamping circuit shown in the drawing is directed to an input circuit which performs voltage clamping of an input signal Vin having a high signal amplitude VCC which is supplied from an external input terminal of a semiconductor integrated circuit device to an input voltage VI corresponding to an operational voltage VDD level of an input circuit IB which is formed in the semiconductor integrated circuit device.

Diodes D1, D2 which constitute an electrostatic breakdown preventing circuit are provided to the input terminal Vin. Although not specifically limited, the semiconductor integrated circuit device having the input circuit of this embodiment includes two power source terminals of the high voltage VCC and of the voltage VDD lower than the voltage VCC. The above-mentioned diode D1 is provided between the input terminal Vin and the high power source terminal VCC, while the above-mentioned diode D2 is provided between the input terminal Vin and a ground potential VSS of the circuit. Although not particularly limited, the power source voltage VCC is a high voltage of approximately 12V, while the power source voltage VDD is a low voltage of approximately 5V. In FIG. 1, symbol Vin is used to imply both of the input terminal and the input signal.

The above-mentioned input terminal Vin is connected to one of source/drain routes of an N-channel MOSFET M1 which constitutes a voltage clamping circuit forming an input node. The power source voltage VDD which is a voltage to be restricted is supplied to a gate of the MOSFET M1. An output voltage which is clamped by the power source voltage VDD is obtained from another source/drain route of the MOSFET M1 and is supplied to the input terminal of the input circuit IB. In this embodiment, to ensure the stable voltage clamping operation by the MOSFET M1, a current source Io which is capable of flowing a DC current component is provided between another source/drain route and the ground potential of the circuit. Further, a capacitor Ci is arranged in parallel to the current source Io.

In this embodiment, to the input terminal Vin, an input signal having a large signal amplitude such as VCC-0V (12V-0V) as indicated by a waveform in the drawing is supplied, and the input signal is converted into a signal having a small signal amplitude restricted by the power source VDD such as (VDD-Vth)-0V through another source/drain route of the MOSFET M1. Further, an output signal Vo which passes through the input circuit IB obtains a CMOS amplitude such as VDD-0V (5V-0V) as indicated by a waveform in the drawing. Here, Vth is a threshold value voltage of the MOSFET M1. Assuming that a substrate of the MOSFET M1 is connected to the input terminal Vin, the MOSFET M1 performs a function equal to a function obtained by connecting a diode in the direction from the input terminal Vin to the input circuit IB and hence, a voltage clamping effect cannot be obtained. Further, although the substrate of the MOSFET M1 may be connected to the ground potential VSS, the threshold value voltage Vth is increased due to a substrate bias effect and hence, an input signal from the input terminal Vin does not reach a logic threshold of the input circuit IB in the next stage thus giving rise to a possibility that an erroneous operation occurs. Accordingly, in this embodiment, the MOSFET M1 is formed on a P-type well region which is electrically separated from the substrate, and such a P-type well (channel region) is connected to another source/drain route on an output side of the MOSFET M1. Due to such a constitution, the voltage clamping circuit can perform the stable clamping operation.

FIG. 2 shows a characteristic chart for explaining an operation of the voltage clamping circuit according to the present invention. FIG. 2(A) is a characteristic chart of input/output voltages, wherein when the input voltage Vin is changed toward the power source voltage VCC from 0V, the output voltage VI is changed corresponding to the input voltage Vin up to VDD-Vth, while even when the input voltage Vin is elevated to VDD-Vth or more, the output voltage VI assumes a fixed level of VDD-Vth thus performing a voltage clamping operation.

FIG. 2(B) is an input voltage-current characteristic chart, and shows that only a constant current flows with respect to the elevation of the input voltage Vin due to the current source Io. Accordingly, it is possible to achieve the low power consumption corresponding to the current value of the current source Io. Here, although the voltage clamping operation may be performed by using the resistance element and a constant voltage element such as a diode, in this case, when a resistance value of the resistance element is decreased to realize a high-speed operation of the circuit, the input current Ii is increased. To the contrary, when the resistance value of the resistance element is increased for realizing the low power consumption, the high-speed operation of the circuit is sacrificed.

FIG. 2(C) shows a voltage change characteristic. In this embodiment, since the input signal Vin is transmitted through the source/drain routes of the MOSFET M1 and hence, the clamp output voltage VI is changed substantially in synchronism with the rise of the input voltage Vin. Due to the characteristics shown in FIG. 2(B) and FIG. 2(C), in the voltage clamping circuit of the present invention, it is possible to realize both of the high-speed operation and the low power consumption.

FIG. 3 is an equivalent circuit diagram for explaining the voltage clamping circuit of the present invention. As shown in the drawing, when a leak current channel attributed to a high resistance LR generated by the defective insulation of the circuit or the like is formed at the node VI on the output side of the MOSFET M1, assuming that the current source Io is not present, the voltage clamping operation becomes inoperable. However, with the provision of the current source Io, the elevation of a potential of the above-mentioned output node VI is suppressed thus enabling the stable voltage clamping operation. Accordingly, by setting the current source Io to a fine current which is larger than the leak current which is not considered defective, it is possible to realize the low power consumption as shown in FIG. 2(B).

FIG. 4 is an equivalent circuit diagram for explaining the voltage clamping circuit of the present invention. As shown in the drawing, a parasitic capacity Cds exists between the source and the drain of the MOSFET M1. Due to the provision of the parasitic capacity Cds, when the input signal Vin is changed to a high voltage such as VCC, there arises a drawback that the output side VI is changed to a value equal to or more than the power source voltage VDD due to the coupling. To obviate such a drawback, a capacitor Ci is provided in parallel to the current source Io. Due to such a constitution, the parasitic capacity Cds and a capacitor Ci are connected in series and hence, the input voltage Vin is divided corresponding to an inverse ratio of the capacity ratio thus preventing the output side VI from assuming a value equal to or more than the power source voltage VDD. Here, in the input circuit IB, a gate capacity of the MOSFET which constitutes the input circuit exists between another terminal of the MOSFET M1 and the ground voltage VSS, between another terminal of the MOSFET M1 and the power source voltage VDD and the like. However, only with such a gate capacity, the output side VI is changed to the value equal to or more than the power source voltage VDD due to the coupling as described above. Accordingly, the above-mentioned capacitor Ci is set to a value which is sufficiently large compared to an input capacity of an input circuit IB.

FIG. 5 shows a specific circuit diagram of one embodiment of the voltage clamping circuit according to the present invention. A MOSFET M1 is equal to the MOSFET M1 shown in FIG. 1, and a capacitor Ci is formed of a MOS capacity. An input circuit IB is constituted of a cascade circuit which includes an input-side CMOS inverter circuit which is formed of a P-channel MOSFET M3 and an N-channel MOSFET M4, and an output-side CMOS inverter circuit which is formed of a P-channel MOSFET M5 and an N-channel MOSFET M6. Although not limited particularly, between an input terminal of an output-side CMOS inverter circuit and a ground potential of a circuit, an N-channel MOSFET M7 is provided thus feedbacking an output signal Vo to a gate.

Due to such a constitution, in the input-side CMOS inverter circuit, when the output signal Vo assumes a low level, the MOSFET M7 assumes an OFF state and the inverter circuit possesses a first logic threshold value corresponding to a conductance ratio between the MOSFETs M3, M4. On the other hand, when the output signal Vo assumes a high level, the MOSFET M7 assumes an ON state and hence, the MOSFET M4 and the MOSFET M7 are arranged in parallel to each other whereby the logic threshold value voltage of the MOSFET M7 is changed to a voltage lower than the above-mentioned first logic threshold value. Accordingly, the input circuit IB possesses the hysteresis transmission characteristic in which when the input signal is changed to the high level from the low level, the MOSFET M7 assumes the above-mentioned first logic threshold value voltage which is a high voltage, while when the input signal is changed to the low level from the high level, the MOSFET M7 assumes the second logic threshold value which is a low value. Accordingly, the input signal Vin assumes the above-mentioned first logic threshold value voltage or more, and the output signal Vo is not changed unless the input signal Vin assumes the second logic threshold value voltage which is lower than the first logic threshold value voltage or less and hence, even when noises are generated when the input signal Vin is in the vicinity of the logic threshold value voltage of the input circuit, the input signal Vo is not changed in response to the noises and hence, it is possible to acquire the stable input signal.

In this embodiment, the current source Io is constituted of a depression-type N-channel MOSFET M2. The MOSFET M2 performs a constant-current operation by connecting a gate and a source thereof. The current source Io may be constituted of an enhancement-type N-channel MOSFET which has a predetermined voltage applied to a gate thereof or a high resistance element which is formed of a polysilicon layer or the like. In the drawing, the above-mentioned diode for preventing electrostatic breakdown is omitted.

Although not particularly limited, as a MOSFET which forms a capacitor Ci, a gate capacity of a P-channel MOSFET is used. This gate capacity is formed by using a MOSFET corresponding to several tens of usual MOSFETs such as MOSFETs M4 or the like, for example. That is, the gate capacity is formed to possess a capacity value of approximately 1 pF. Here, the MOSFET M1 and the MOSFET M2 are configured to have large sizes respectively such that the MOSFET M1 has a channel width W of 20 μm and a channel length L of 800 nm and the MOSFET M2 has a channel width W of 20 μm and a channel length L of 8 μm. To the contrary, the N-channel MOSFET M4 and the N-channel MOSFET M6 which constitute the CMOS inverter circuit are configured to have small sizes respectively such that the N-channel MOSFET M4 has a channel width W of 8 μm and a channel length L of 2 μm and the N-channel MOSFET M6 has a channel width W of 7 μm and a channel length L of 800 nm.

FIG. 6 shows an operational waveform chart for explaining the voltage clamping circuit according to the present invention. In FIG. 6, actual measured waveform charts of an input voltage Vin, a clamping voltage VI and an output voltage Vo are shown. The voltage clamping circuit is the circuit shown in FIG. 5, wherein the input voltage Vin has high amplitude of 0-12V and a low voltage VDD of 5V. As shown in the drawing, a clamping voltage VI such as VDD-Vth(the threshold value voltage of the MOSFET M1) is obtained with respect to the input voltage Vin thus enabling the acquisition of the output voltage Vo of CMOS level through two CMOS inverter circuits having the above-mentioned hysteresis characteristic.

FIG. 7 is a rise characteristic chart showing the relationship between the input voltage Vin and the clamping voltage VI of the voltage clamping circuit according to the present invention using a capacity value of the capacitor Ci in the voltage clamping circuit as a parameter. In a state that capacitor Ci is set as Ci=0, that is, the capacitor Ci is not connected, due to coupling of the parasitic capacity Cds between the source and the drain of the MOSFET M1, the clamping voltage VI is largely elevated by approximately 7.8V and, thereafter, along with the discharge performed due to the above-mentioned current source Io, the clamping voltage VI is gradually lowered. That is, the input capacity of the inverter circuit of the CMOS inverter circuit formed of the MOSFET M3 and the MOSFET M4 is small and hence, due to the division of voltage with the parasitic capacity Cds, the clamping voltage VI is largely elevated by approximately 7.8V.

When the capacity value of the capacitor Ci is set to Ci=0.5 pF, Ci=1 pF, Ci=1.5 pF and Ci=2 pF respectively, the clamping voltage VI is suppressed to approximately 3.6V, 3V, 2.6V, 2.2V respectively. Since the capacitor Ci is also the input capacity of the input circuit, when the capacity value is increased, a charge time up to the clamping voltage VI via the MOSFET M1 or the discharge time at the time of rising the voltage is prolonged and hence, in this embodiment, the capacity value Ci is set to Ci=1 pF which is considered as a necessary minimum. With respect to the coupling operation of the parasitic capacity Cds, by properly setting the capacity value of the capacitor Ci, it is possible to rise or fall the clamping voltage VI at a high speed by making use of the coupling.

FIG. 8 is a rise characteristic chart of the input voltage Vin of the voltage clamping circuit according to the present invention. The drawing shows a rise portion shown in FIG. 6 in an enlarged manner. In the voltage clamping circuit of this embodiment, the input voltage Vin rises from 0V to 12V within 1 ns, rises from up to a voltage close to 3V due to coupling of the parasitic capacity Cds within an approximately same time, and finally rises to VDD (5V)-Vth by a charging operation by the MOSFET M1. In the input circuit IB made of the two-stage CMOS inverter circuit, the output voltage Vo is allowed to rise to a high level with a signal transmission delay time of approximately 2 ns.

FIG. 9 shows a fall characteristic chart of the input voltage Vin of the voltage clamping circuit according to the present invention. The drawing shows a time of a voltage fall portion shown in FIG. 6 in an enlarged manner. In the voltage clamping circuit of this embodiment, the input voltage Vin falls from 12V to 0V, within 1 ns and falls to a value equal to or less than a threshold value voltage of the input circuit IB due to coupling of the parasitic capacitance Cds and a discharging operation of the MOSFET M1 within an approximately same time. Although 1 ns is further necessary to make the input voltage Vin fall to 0V finally, as viewed from the input circuit IB as described above, the input voltage is approximately equal to 0V. In the input circuit IB which is formed of the two-stage CMOS inverter circuit, the output voltage Vo is allowed to fall to a low level with a signal transmission delay time of approximately 2 ns.

FIG. 10 is a block diagram of one embodiment of a switching power source device in which the voltage clamping circuit according to the present invention is used. The switching power source device of this embodiment is constituted of a control IC and a driver IC, and is a step-down type switching power source which makes the input voltage Vin which is formed of a high voltage fall to the output voltage Vout which is formed of a low voltage. Although not particularly limited, the above-mentioned step-down type switching power source is provided for further converting the high voltage formed by converting a commercially-available AC voltage of 100V to a DC voltage of 12V to a low voltage of approximately 3V which is used in operations of a CPU (central processing unit) which constitutes a microcomputer, a memory circuit and the like.

The switching power source device includes a first switching element of a driver IC which forms a smoothing output voltage Vout by connecting a capacitor CO to an inductor LO in series, and controls a current which is made to flow from the input voltage Vin such as approximately 12V to the above-mentioned inductor LO thus allowing the output voltage Vout to assume a predetermined voltage, and a second switching element which clamps a counter electromotive voltage which is generated in the inductor LO when the first switching element assumes an OFF state to a predetermined potential (PGND). To allow the above-mentioned output voltage Vout to assume the predetermined voltage, the output voltage Vout is divided by resistances R1, R2, and the output voltage Vout is supplied to an error amplifier EA which is provided to a control IC and is compared with a predetermined voltage. An output voltage of the error amplifier EA and a triangular wave which is formed by a triangular wave generating circuit TWG are supplied to a voltage comparator CMP, and an output signal of the voltage comparator CMP is transmitted to a control circuit CONT thus forming a PWM (pulse width modulation) signal. This PWM signal is used as a control signal for the above-mentioned first switching element and second switching element of the above-mentioned driver IC. That is, a current which is made to flow in the above-mentioned inductor LO is controlled by controlling an ON period of the above-mentioned first switching element in response to the PWM signal.

Although not particularly limited, a high voltage VDD such as 12V is supplied to the control IC, while an input voltage of the above-mentioned error amplifier is a small voltage and hence, a low voltage of approximately 5V is formed by an internal power source circuit, and the error amplifier EA, the comparator CMP, the triangular wave generating circuit TWG, and the control circuit CONT which forms the PWM signal are operated by the input voltage. Accordingly, a low voltage such as 5V may be directly supplied to the control IC.

In the above-mentioned driver IC, although not particularly limited, a high voltage such as 12V which is equal to the input voltage Vin is supplied to the above-mentioned power source voltage terminal VDD. A terminal REG is an external terminal to which a capacitor C2 for stabilizing an output voltage of an inner step-down power source circuit Reg described later is connected, while an operational voltage of a driving circuit which drives the above-mentioned second switching element as described later is supplied to a terminal VLDRV. A terminal BOOT is connected to a bootstrap capacity C1 which boosts an operational. voltage of a driving circuit for driving the above-mentioned first switching element as described later. Another electrode of this capacity C1 is connected to an output terminal LX to which the inductor LO is provided. An operational control signal which performs an operation control (ON/OFF) of the driver IC is inputted to a terminal DISBL.

FIG. 11 is a block diagram showing one embodiment of the driver IC shown in FIG. 10. The abovementioned first switching element is constituted of a power MOSFET Q1 and is driven in response to a boosting voltage signal which corresponds to the input voltage Vin supplied from the first driving circuit (high-side driver) HSD. That is, the MOSFET Q1 is constituted of an N-channel type and hence, when a driving voltage corresponding to the input voltage Vin is supplied to a gate of the MOSFET Q1, an output voltage is lowered by an amount corresponding to a threshold value voltage.

Accordingly, to allow the supply of the input voltage Vin to the inductor LO, when the MOSFET Q1 assumes an OFF state, that is, when the output terminal LX substantially assumes a ground potential PGND of the circuit attributed to an ON state of a MOSFET Q2 which is a switching element for clamping, the bootstrap capacity C1 is charged with a voltage such as approximately 5V formed by the internal power source Reg through a Shottky barrier diode SBD. Then, when the MOSFET Q2 assumes an OFF state and the MOSFET Q1 assumes an ON state, along with the elevation of a source output voltage of the MOSFET Q1 attributed to the bootstrap capacitor C1, a voltage of the terminal BOOT is elevated by an amount corresponding to a voltage stored in the bootstrap capacity C1, and the elevated voltage is transmitted to a gate of the MOSFET Q1 through the first driving circuit HSD. Accordingly, the gate of the MOSFET Q1 also assumes a voltage higher than the input voltage Vin by the voltage stored in the bootstrap capacity C1 and hence, it is possible to increase the voltage of the output terminal LX to the voltage Vin.

In this embodiment, the MOSFET Q2 which constitutes the second switching element is configured to be driven with the above-mentioned high voltage by the second driving circuit (low-side driver) LSD. That is, the second driving circuit LSD is configured to be operated with the voltage supplied from the terminal VLDRV. To the above-mentioned terminal VLDRV, the above-mentioned 12V may be applied or the low voltage of approximately 5V may be supplied. The user can arbitrarily set such a voltage supplied to the terminal VLDRV. When the terminal VLDRV is operated with the high voltage such as 12V, an ON resistance value of the MOSFET Q2 can be reduced and hence, a reactive current in the switching power source can be reduced.

In the above-mentioned control IC, the PWM signal is formed by the control circuit CONT which is operated with the low voltage lower than the above-mentioned input voltage such that the output voltage Vout obtained from the capacitor CO assumes a predetermined voltage (for example, approximately 3V). In the driver IC, a control logic circuit which forms driving signals of the first driving circuit HSD and the second driving circuit LSD is, as indicated by a dotted line in the drawing, constituted of the gate circuits G1 to G5 which are operated with a low voltage formed by the power source circuit Reg. In the switching power source, it is necessary to afford a dead time to the MOSFET Q1 which constitutes the first switching element and the MOSFET Q2 which constitutes the second switching element to prevent the MOSFET Q1 and the MOSFET Q2 from simultaneously assuming an ON state thus preventing an element breakdown attributed to a through current.

Accordingly, by clamping the voltage of the driving signal supplied to the gate of the MOSFET Q1 which constitutes the first switching element by the voltage clamping circuit CP3 shown in FIG. 1 or FIG. 5 such that the voltage of the driving signal supplied to the gate of the MOSFET Q1 which is inputted to the input node of the voltage clamping circuit CP3 corresponding to the above-mentioned low voltage is clamped, the driving signal is used as a feedback signal for the gate circuit G5 which forms an input signal transmitted to the second driving circuit LSD. By clamping the voltage of the driving signal supplied to the gate of the MOSFET Q2 which constitutes the second switching element by voltage clamping circuit CP2 shown in FIG. 1 or FIG. 5 such that the voltage of the driving signal supplied to the gate of the MOSFET Q2 which is inputted to the input node of the voltage clamping circuit CP2 corresponding to the above-mentioned low voltage is clamped, the driving signal is used as a feedback signal for the gate circuit G4 which forms an input signal transmitted to the first driving circuit HSD. That is, the voltage clamping circuits CP3, CP2 are operated as level shifting circuits which convert the driving signals of high amplitude to the signals of low amplitude and set a dead time to prevent the first and second switching elements from simultaneously assuming an ON state, that is, by setting the MOSFET Q2 in an ON state upon receiving a signal which brings the MOSFET Q1 into an OFF state and by setting the MOSFET Q1 in an ON state upon receiving a signal which brings the MOSFET Q2 into an OFF state.

In this embodiment, as a circuit which performs the above-mentioned level shifting operation, the voltage clamping circuit is used. The voltage clamping circuit of this embodiment exhibits the high-speed transmission characteristic and hence, the voltage clamping circuit can set a small dead time for preventing the MOSFET Q1 and MOSFET Q2 from simultaneously assuming an ON state. That is, provided that the switching cycles of the MOSFET Q1 and the MOSFET Q2 are equal, a voltage control with high accuracy can be realized by an amount corresponding to the shortening of the dead time.

The output signal of the gate circuit G4 is the low-voltage signal as described above and hence, the output signal is converted into an input signal of the first driving circuit HSD through a level shifting circuit LSU which converts the output signal into a high voltage signal. Further, in the level shifting circuit LSU and the first driving circuit HSD, a potential of the output terminal LX is used as a reference potential of the circuits. In the control logic circuit, the power source circuit Reg, the input circuit IB of PWM as well as a voltage clamping circuit CP1 and a low level detecting circuit UVL explained hereinafter, a potential which is supplied from a terminal CGND is used as a reference potential of these circuits. That is, by separating the ground potential CGND of these circuits from a ground potential PGND for clamping a counter electromotive voltage of the inductor, it is possible to stabilize the operation.

An input signal from DISBL which controls an active/reactive (ON/OFF) state of the operation of the driver IC can be used with simple amplitude which falls within a range from 5V to 12V. Accordingly, by estimating a case in which the driver IC is operated with the high signal amplitude such as 12V, the voltage clamping circuit CP1 shown in FIG. 1 is provided. Due to such a constitution, even when the driver IC is operated with the high signal amplitude such as 12V, it is possible to operate the driver IC with low power consumption. When the input signal of low voltage such as 5V is supplied by a chance, the substantial clamping operation is not performed. However, the operation of the driver IC per se is not influenced at all.

According to the above-mentioned embodiment, it is possible to perform the voltage clamping operation in a stable manner at a high speed with low power consumption. Further, due to the voltage clamping operation which responds to the change of the input voltage rapidly, it is possible to shorten the dead time for changing over the first switching element and the second switching element of the switching power source device.

FIG. 12 is a block diagram showing another embodiment of the driver IC shown in FIG. 10. In this embodiment, the driver IC adopts the multiple-chip module structure which is constituted by sealing three silicon chips in one package. That is, a power MOSFET Q1 and a power MOSFET Q2 are formed on respectively separate semiconductor substrates made of silicon or the like as indicated by a dotted line in the drawing (silicon chips) CHP1, CHP2, a circuit which constitutes a driver IC other than the above-mentioned power MOSFET Q1 and MOSFET Q2 is formed on one semiconductor substrate made of silicon or the like (silicon chip) CHP3, and these chips are sealed in one package thus constituting the above-mentioned driver IC. In such a driver IC adopting the multiple-chip module constitution, it is possible to manufacture a product having high performance at a low cost compared to the formation of all circuits which constitute the driver IC on one semiconductor substrate as shown in FIG. 11.

Although the invention which is made by inventors of the present invention has been specifically explained in conjunction with the embodiments, the present invention is not limited to such embodiments and various modifications can be made without departing from the gist of the present invention. For example, in FIG. 1 and FIG. 6, the size of the MOSFET Q1, the capacity value of the capacitor Ci and the current of the current source Io may be properly determined corresponding to the application of the voltage clamping. The present invention is popularly used in the voltage clamping circuit (voltage level shifting circuit) and, switching power source device, and the semiconductor integrated circuit device used in the switching power source device.

BRIEF EXPLANATION OF DRAWINGS

FIG. 1 is a circuit diagram showing one embodiment of a voltage clamping circuit according to the present invention.

FIG. 2 is a characteristic chart for explaining an operation of the voltage clamping circuit according to the present invention.

DESCRIPTION OF REFERENCE NUMERALS AND SIGNS

Figure 3:
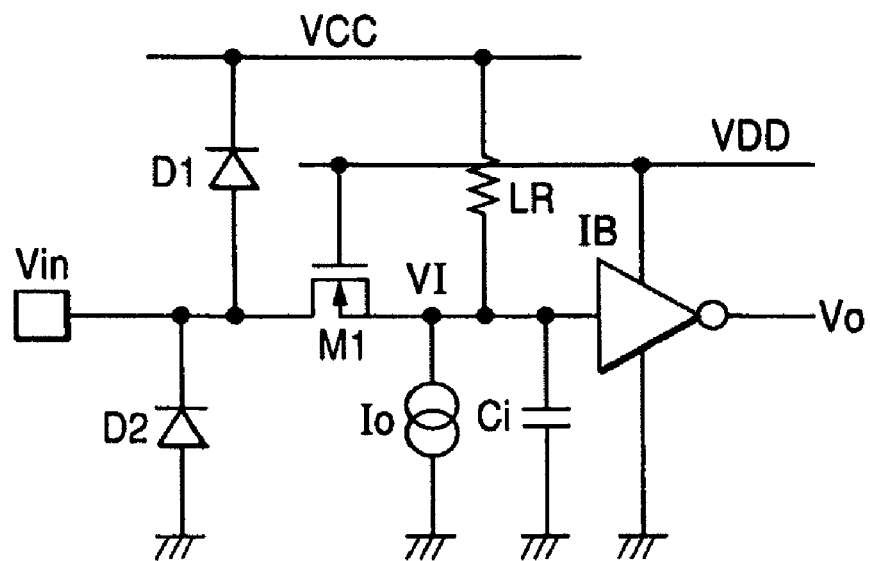
FIG. 3 is an equivalent circuit diagram for explaining the voltage clamping circuit according to the present invention.
Figure 4:
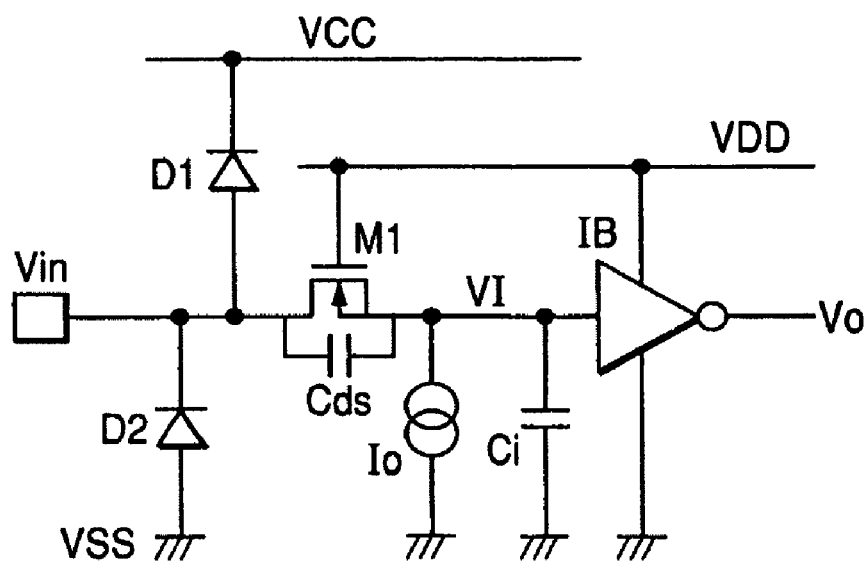
FIG. 4 is an equivalent circuit diagram for explaining the voltage clamping circuit according to the present invention.
Figure 5:
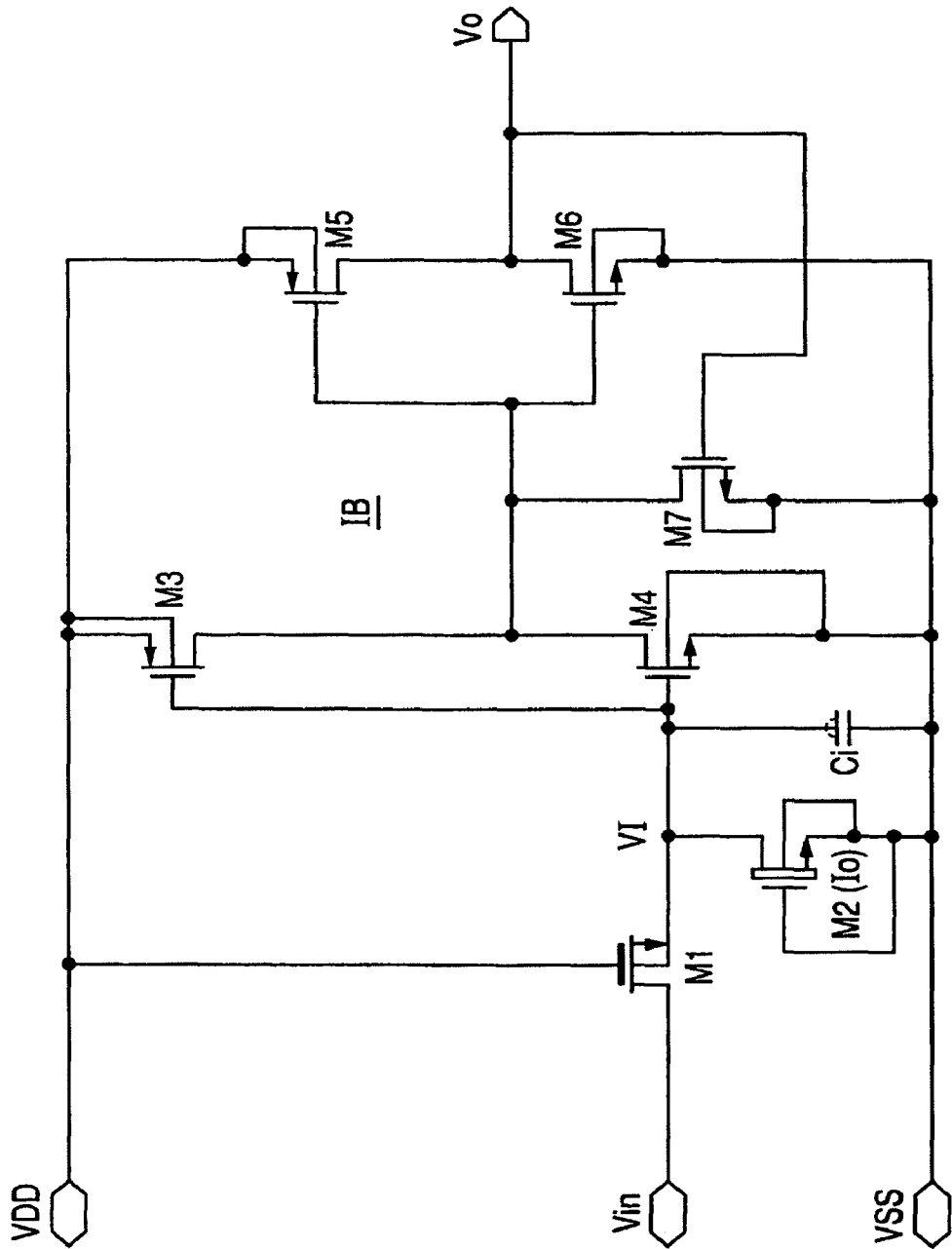
FIG. 5 is a specific circuit diagram showing one embodiment of the voltage clamping circuit according to the present invention.
Figure 6:
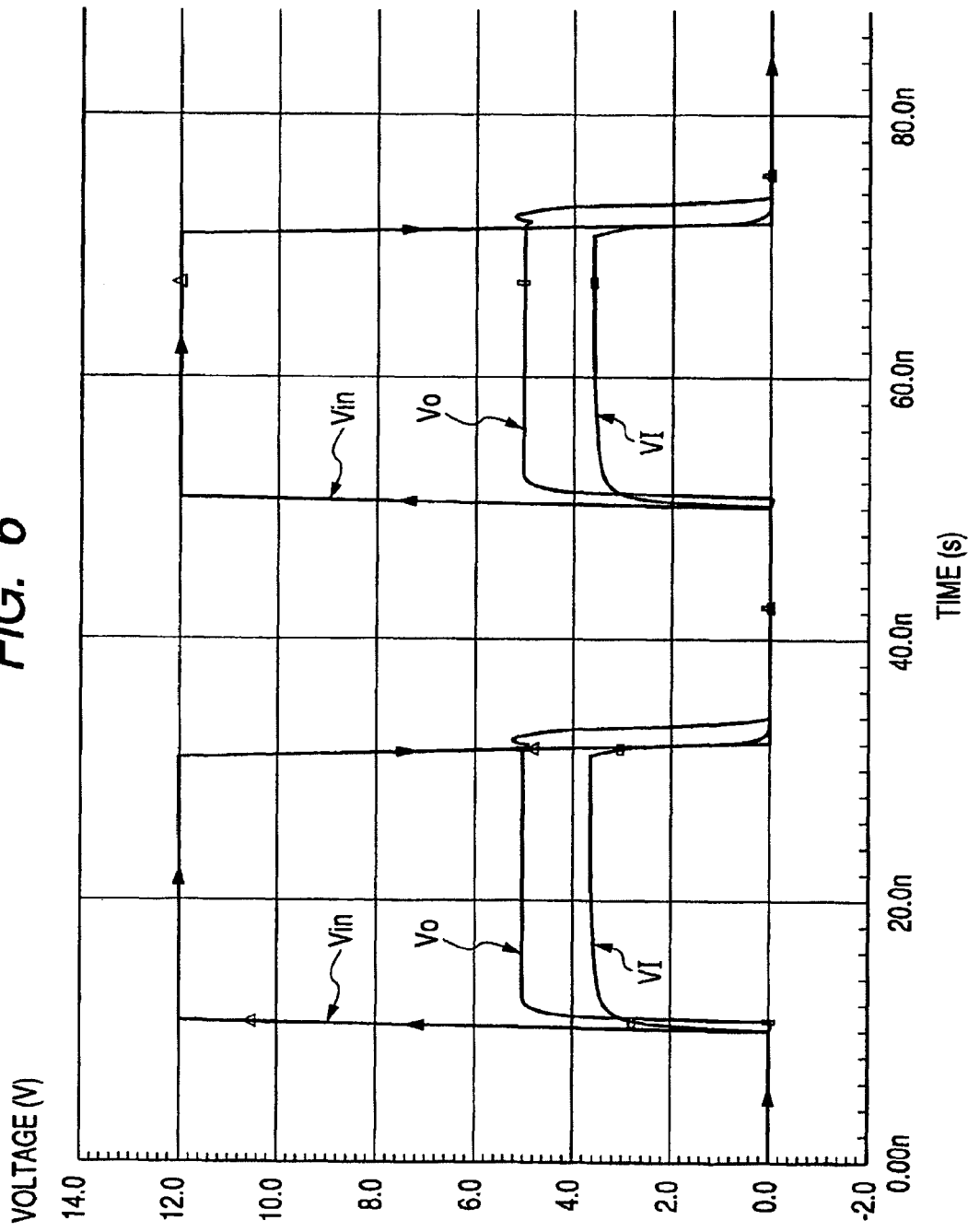
FIG. 6 is an operational waveform chart for explaining the voltage clamping circuit according to the present invention.
Figure 7:
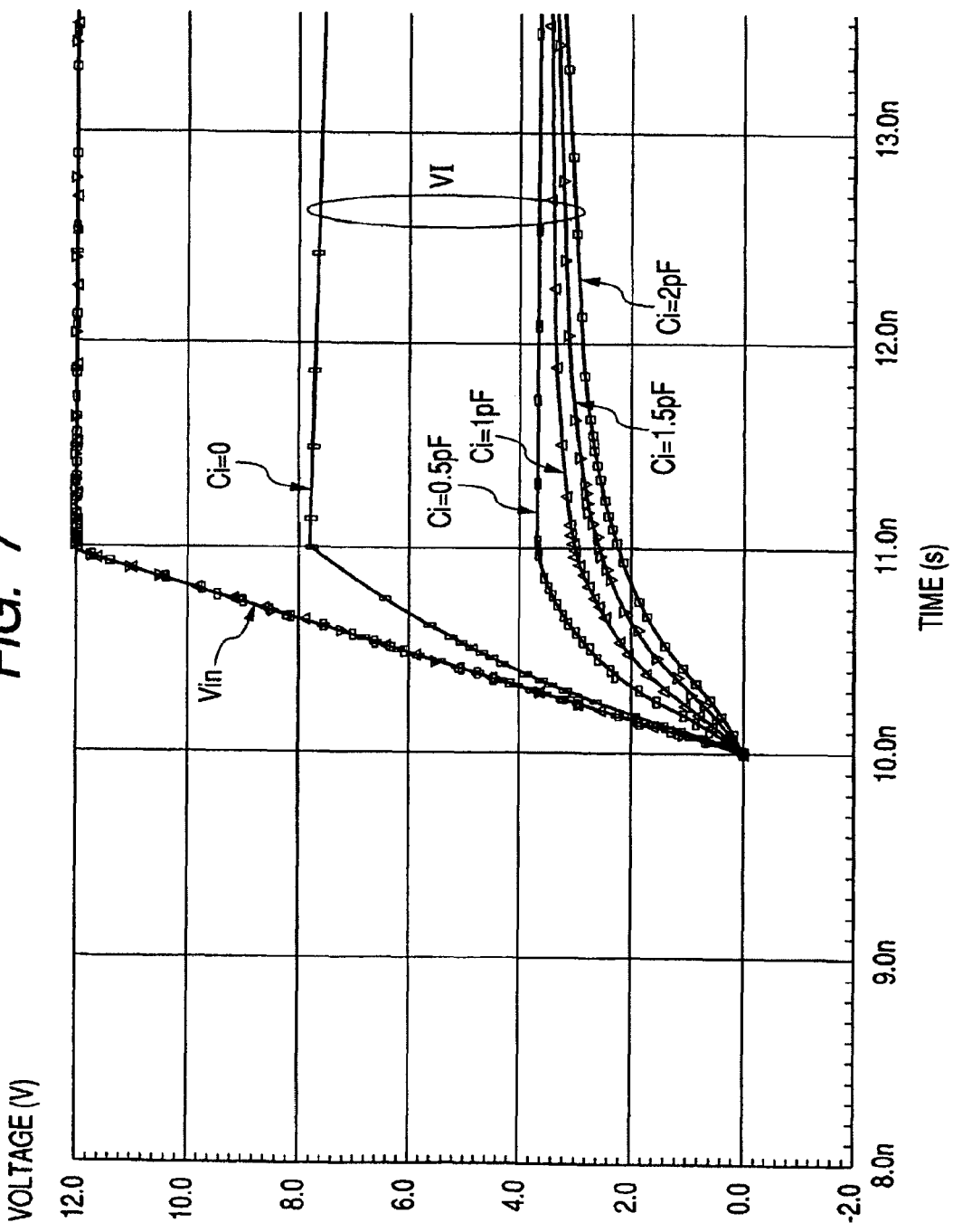
FIG. 7 is a characteristic chart showing the relationship between an input voltage and a clamp voltage of the voltage clamping circuit according to the present invention.
Figure 8:
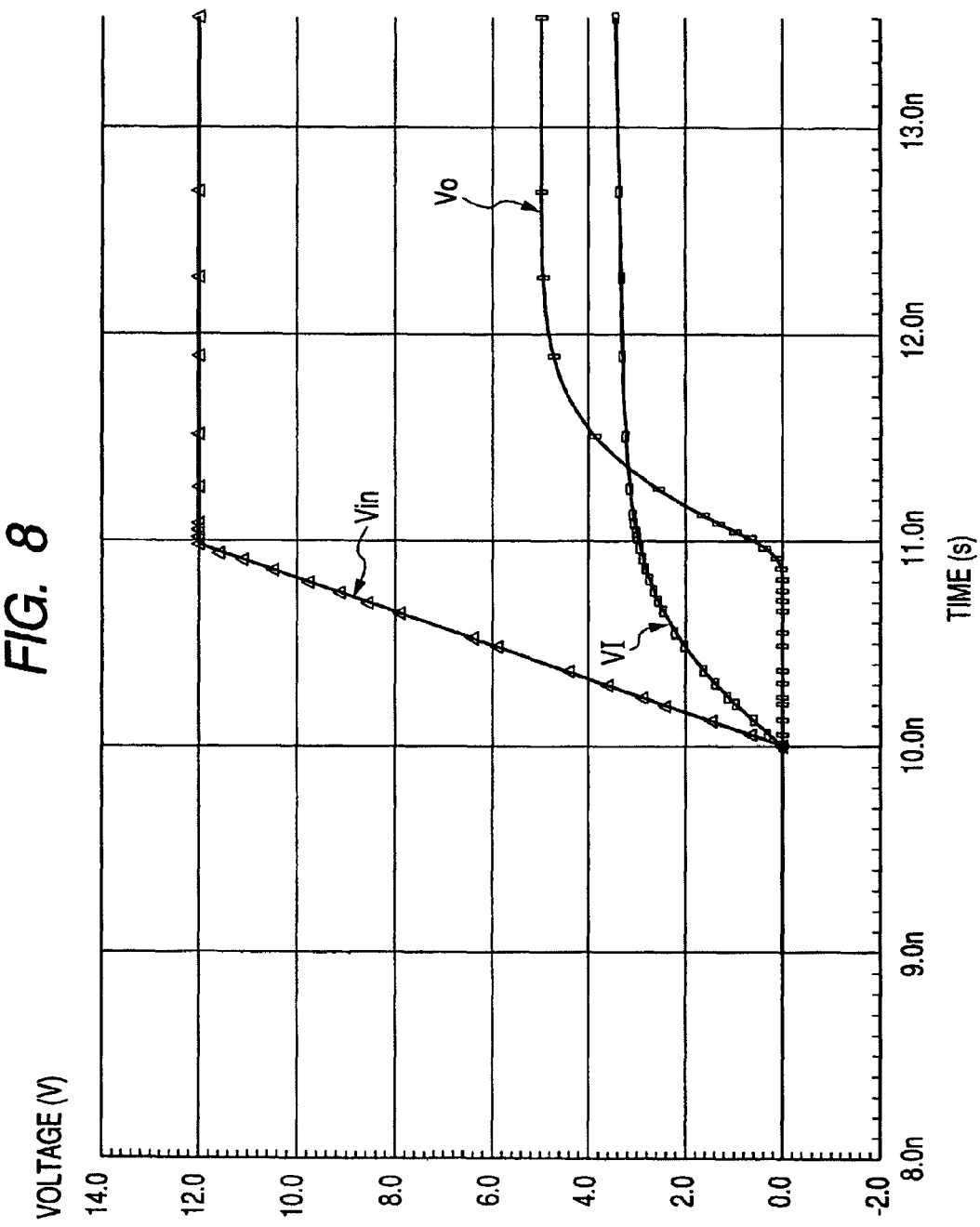
FIG. 8 is a rise characteristic chart of the input voltage of the voltage clamping circuit according to the present invention.
Figure 9:
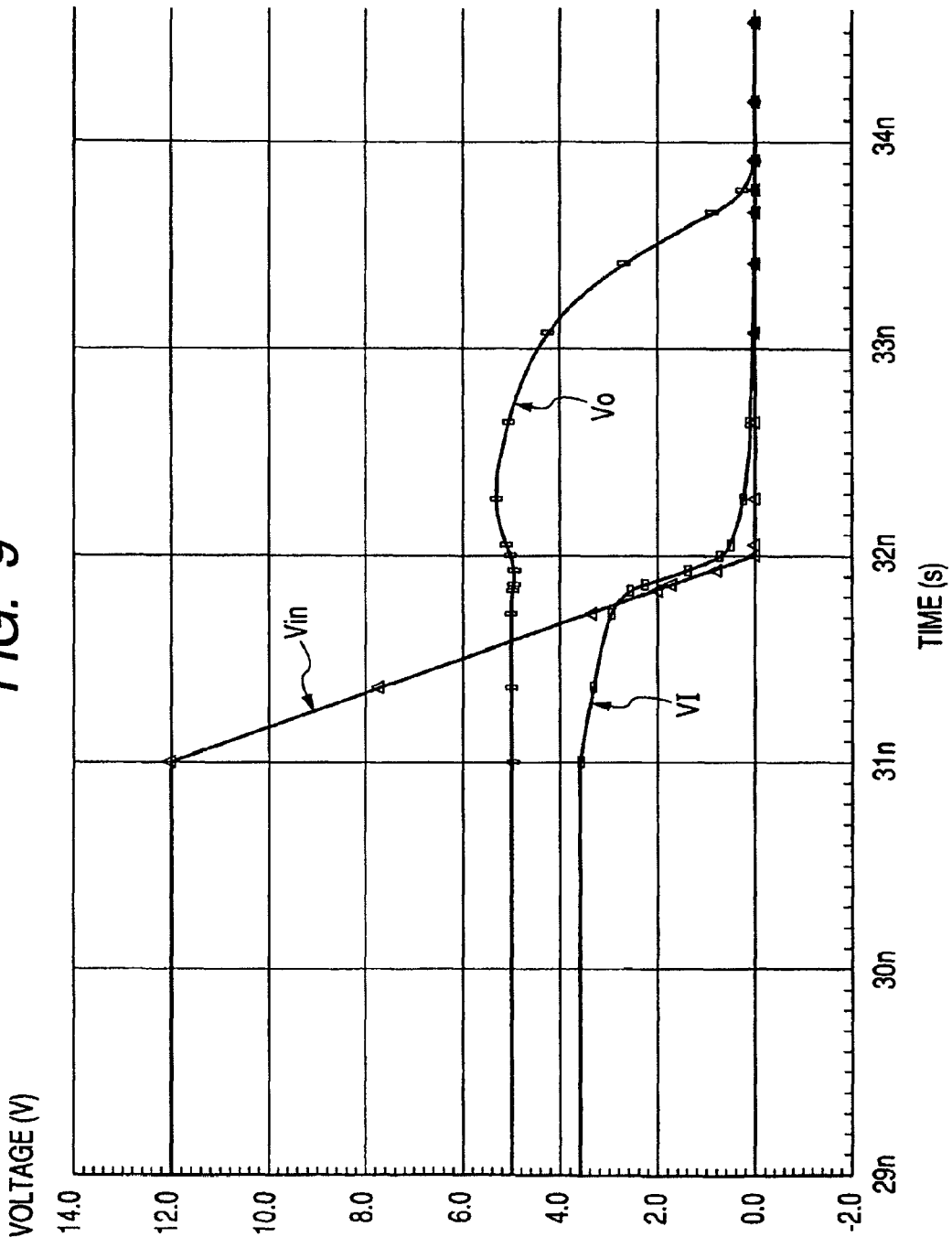
FIG. 9 is a fall characteristic chart of the input voltage of the voltage clamping circuit according to the present invention.
Figure 10:
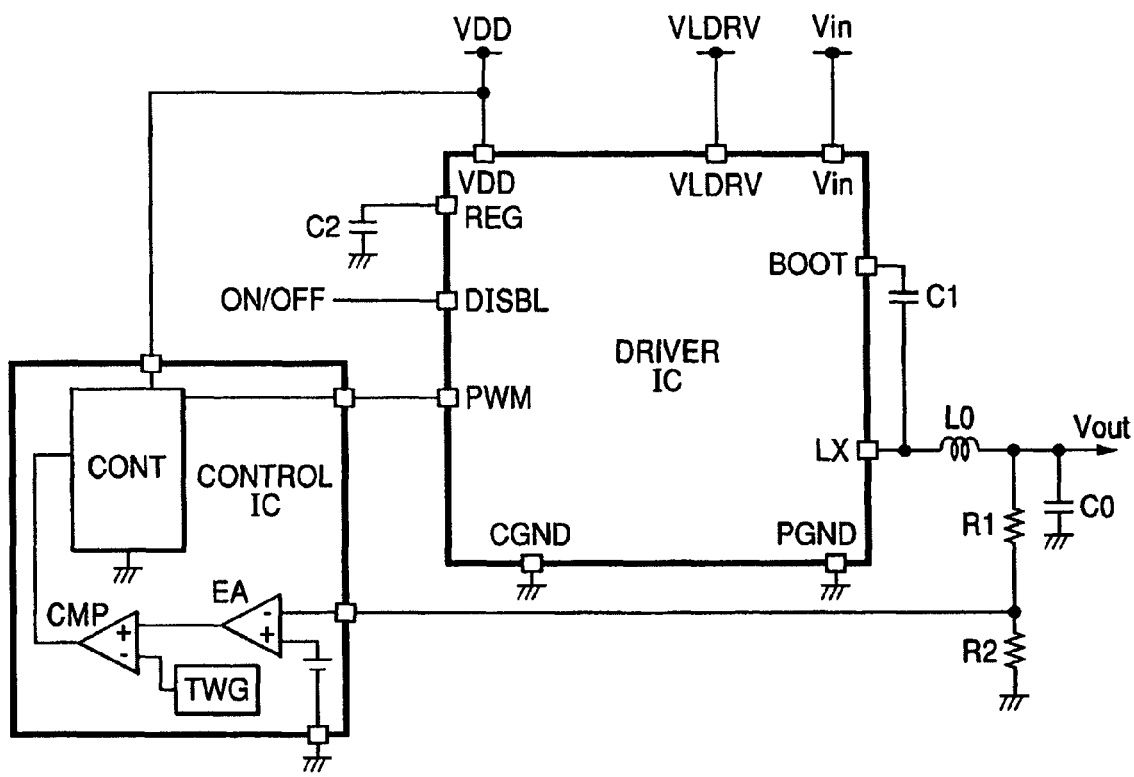
FIG. 10 is a block diagram showing one embodiment of a switching power source device to which the voltage clamping circuit according to the present invention is applied.
Figure 11:
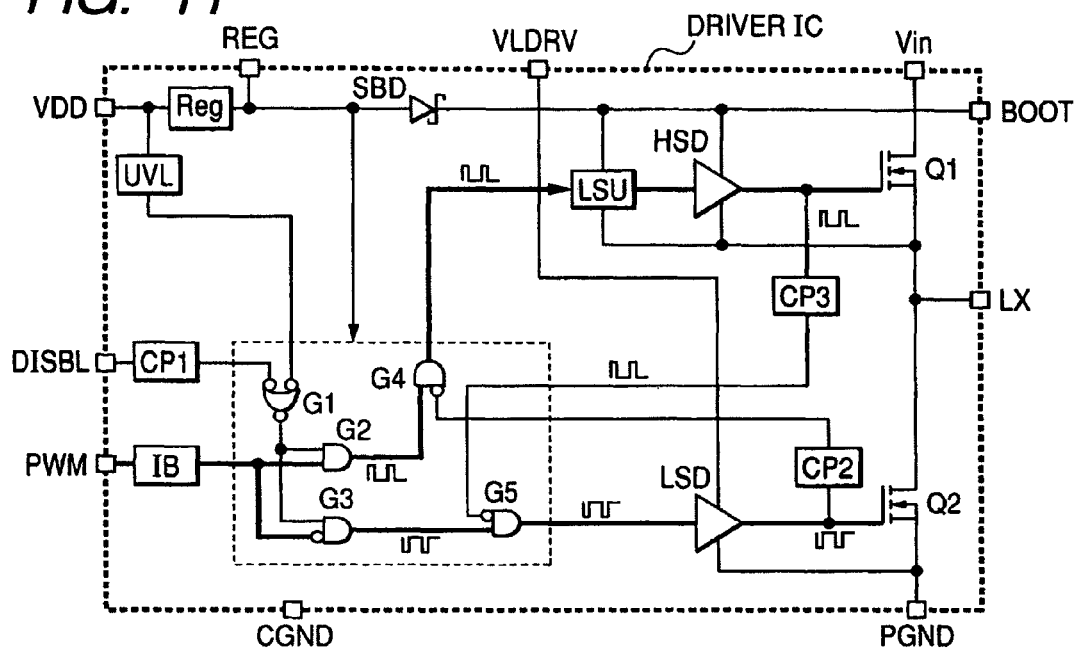
FIG. 11 is a block diagram showing one embodiment of a driver IC shown in FIG. 10.
Figure 12:
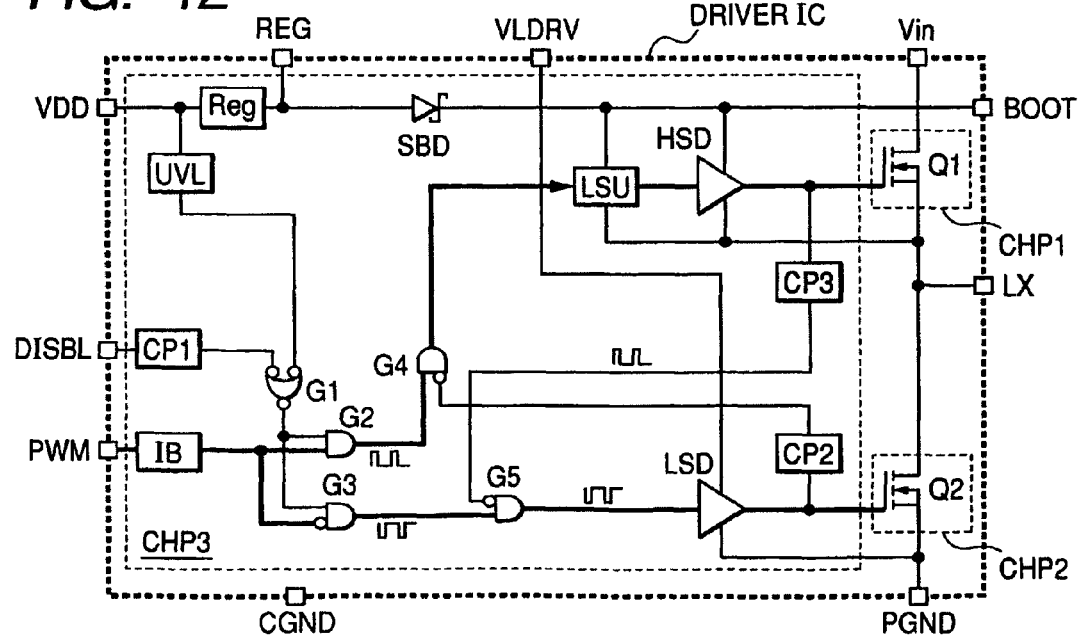
FIG. 12 is a block diagram showing another embodiment of the driver IC shown in FIG. 10.

D1, D2: diode, M1 to M6: MOSFET, Io: current source, Ci: capacitor, Cds: parasitic capacity, IB: input circuit, CPNT: control circuit, EA: error amplifier, CMP: voltage comparator, TWG: triangular wave-generating circuit, CI: bootstrap capacity, LO: inductor, CO, C1: capacitor, HSD: first driving circuit, LSD: second driving circuit, CP1 to CP3: voltage clamping circuit, Reg: power source circuit, LSU: level shifting circuit, G1 to G5: gate circuit, SBD: Schottky barrier diode, Q1, Q2: power MOSFET (first, second switching element), CHP1 to CHP3: silicon chip

The invention claimed is:

1. A voltage clamping circuit comprising:
an input terminal to which an input voltage is supplied;
a MOSFET which has either one of source/drain routes thereof connected to the input terminal and has a predetermined voltage supplied to a gate thereof; and
a current source which is provided between another source/drain route of the MOSFET and a ground potential of the circuit,
wherein the voltage clamping circuit obtains an output voltage from another source/drain route of the MOSFET,
wherein a capacitor is provided in parallel to the current source,
wherein the capacitor is a MOS capacitor which is configured to have a sufficiently large capacitance value with respect to a drain-source parasitic capacitance of the MOSFET, and
wherein the current source is a depression type MOSFET which connects a gate and a source thereof to each other.

2. A voltage clamping circuit according to claim 1, p1 wherein the output voltage is supplied to an input of a first CMOS inverter circuit which is operated with a power source voltage smaller than the input voltage.

3. A voltage clamping circuit according to claim 2,
wherein an output signal of the first CMOS inverter circuit is transmitted to an input of a second CMOS inverter circuit on a next stage, and
wherein an output signal of the second CMOS inverter circuit is fed back to a gate of the MOSFET which is provided between an input terminal of the second CMOS inverter circuit and a ground potential of the circuit thus allowing the first CMOS inverter circuit to possess a hysteresis transmission characteristic.

4. A switching power source device comprising:
an inductor;
a first capacitor which is provided in series with the inductor and forms an output voltage;
a first switching element which controls a current which is made to flow in the inductor by performing a switching control of an input voltage;
a second switching element which performs a switching operation which possesses time in which the second switching element assumes an ON state when the first switching element assumes an OFF state thus controlling the current;
a first driving circuit which is operated by a first voltage corresponding to an input voltage thus driving the first switching element;
a second driving circuit which is operated by a second voltage thus driving the second switching element;
a control circuit which forms a PWM signal so that the output voltage which is obtained from the first capacitor becomes a predetermined voltage; and
a control logic circuit which is operated by the input voltage or a third voltage which is lower than the second voltage, and forms a driving signal for the first driving circuit and the second driving circuit by receiving the PWM signal,
wherein the control logic circuit includes a first voltage clamping circuit which performs voltage clamping of a driving signal for the first switching element in response to the third voltage and feeds back the driving signal for the first switching element to an input of the second driving circuit, and a second voltage clamping circuit which performs voltage clamping of a driving signal for the second switching element in response to the third voltage and feeds back the driving signal for the second switching element to an input of the first driving circuit, and performs a switching control to prevent the first and second switching elements from simultaneously assuming an ON state, and
wherein the first and second voltage clamping circuits respectively include
an input node,
a MOSFET which has either one of source/drain routes connected to the input node and the third voltage supplied to a gate thereof; and
a current source which is provided between another source/drain route of the MOSFET and a ground potential of the circuit,
wherein the voltage clamping circuit obtains a feedback signal which is generated by performing the voltage clamping of the signal from the input node from another source/drain route of the MOSFET.

5. A switching power source device according to claim 4,
wherein the switching power source device includes a third voltage clamping circuit, and
wherein the third voltage clamping circuit is constituted of an input node to which an input signal for controlling an active/reactive (ON/OFF) state of the switching power source device,
a MOSFET which has either one of the source/drain routes thereof connected to the input node and has the third voltage supplied to a gate thereof, and
a current source which is provided between another source/drain route of the MOSFET and the ground potential of the circuit,
wherein the voltage clamping circuit obtains control signal which is generated by performing the voltage clamping of the input signal from another source/drain route of the MOSFET.

6. A switching power source device according to claim 4, wherein a second capacitor is provided in parallel to the current source.

7. A switching power source device according to claim 6, wherein the second capacitor is a MOS capacitance which is configured to have a sufficiently large capacitance value with respect to a drain-source parasitic capacitance of the MOSFET, and
wherein the current source is formed of a depression type MOSFET which connects a gate and a source thereof to each other.

8. A switching power source device according to claim 4, wherein the current source allows a DC current component to flow therethrough.

9. A switching power source device according to claim 8, wherein a second capacitor is provided in parallel to the current source.

10. A switching power source device according to claim 9, wherein the feedback signal is supplied to an input part of the control logic circuit which is operated with the third voltage smaller than the driving signal.

* * * * *